United States Patent [19]

Parker

[11] Patent Number: 5,557,208
[45] Date of Patent: Sep. 17, 1996

[54] BATTERY TESTER WITH STACKED THERMOCHROMIC ELEMENTS

[75] Inventor: Robert Parker, Alamo, Calif.

[73] Assignee: Duracell Inc., Bethel, Conn.

[21] Appl. No.: 479,272

[22] Filed: Jun. 7, 1995

Related U.S. Application Data

[62] Division of Ser. No. 24,423, Mar. 1, 1993, Pat. No. 5,491, 420.

[51] Int. Cl.⁶ .......................... G01R 27/26; H01M 10/48
[52] U.S. Cl. .......................... 324/435; 340/636; 359/51; 429/91
[58] Field of Search .................... 324/435, 104, 324/105, 426–429; 345/106; 340/636; 359/51, 98; 429/91–93

[56] References Cited

U.S. PATENT DOCUMENTS

| | | | |
|---|---|---|---|
| 4,501,503 | 2/1985 | Buirley et al. | 374/162 |
| 4,702,563 | 10/1987 | Parker | 324/104 |
| 4,835,475 | 5/1989 | Hanakura et al. | 324/435 |

*Primary Examiner*—Maura K. Regan
*Attorney, Agent, or Firm*—Ronald S. Cornell; Robert J. Feltovic; Barry D. Josephs

[57] ABSTRACT

A thermochromic apparatus for testing dc voltage sources, particularly small, low voltage disposable batteries, employs a very thin resistive heater layer deposited onto a flexible dielectric substrate. A series of thermochromic elements are "stacked" (mounted on top of one another) at a single thermochromic site proximate the resistive heater. During testing current from the battery flows through the resistive layer heats the substrate, causing a series of thermochromic elements mounted on the substrate to undergo visual "temperature events" (such as color changes) at progressively higher temperatures. The thermochromics may be stacked in a series of discrete films, each film containing a dye for one temperature event. Alternatively, the thermochromics may be contained in microcapsules in a common film.

14 Claims, 4 Drawing Sheets

BATTERY TESTER WITH STACKED THERMOCHROMIC ELEMENTS

This application is a division of application No. 08/024,423, filed Mar. 1, 1993, now U.S. Pat. No. 5,491,420.

TECHNICAL FIELD

This invention relates to multi-color battery testers, and more particularly to such testers employing a plurality of stacked thermochromic elements positioned at a single test site.

BACKGROUND

Heretofore, single-color tapered testers for small disposable batteries had a single elongated thermo-responsive element extending along a resistive heater strip. A taper in the heater strip created a test current density gradient which produced a corresponding test equilibrium temperature gradient along the active area. These tapered testers normally employed a single LCD (liquid crystal display) element mounted over the temperature gradient next to a status scale. The LCD had a single response temperature. The user determined the status of the battery by observing the point on the scale where the increasing equilibrium temperature along the temperature gradient was equal to the fixed response temperature of the LCD. Mis-registration of the status scale along the temperature gradient reduced the accuracy of the testing. The following U.S. patent issued to Robert Parker teach tapered battery testers: U.S. Pat. No. 4,006,414 issued on Feb. 1, 1977; U.S. Pat. No. 4,702,563 issued on Oct. 27, 1987; U.S. Pat. No. 4,702,564 issued on Oct. 27, 1987; U.S. Pat. No. 4,726,661 issued on Feb. 23, 1988, and U.S. Pat. No. 4,737,020 issued on Apr. 12 1988.

Prior multi-element testers for small disposable batteries had a series of thermo-responsive elements spaced the along the tester in a series of adjacent sites. The thermo-responsive elements had progressively higher activation temperatures which indicated the status of the battery. The large interface area between the series of elements and the body of the battery permitted heat loss from the tester into the battery. This heat loss increased the response time of the tester, and reduced the test temperature. U.S. Pat. No. 4,835,475 issued on May 30, 1989 to Niichi Hanakura shows such a multi-site, multi-element configuration.

A single element, sliding contact tester is shown in U.S. Pat. No. 5,491,420 issued on Feb. 13, 1996, to Robert Parker. The operating length of the resistive heater strip is manually decreased during the testing by pulling on one end of the tester causing a sliding contact between the heater and one terminal of the battery. The lower electrical resistance of the shortened heater permits the lower current from partially expired batteries to activate the thermo-responsive element.

SUMMARY

It is therefore an object of this invention to provide battery tester having a plurality of stacked thermochromic elements positioned at a single test site which occupies a minimal area on the test of the tester.

It is a further object of this invention to provide such a battery tester having minimal heat exchange between the test site and the body of the battery under test.

It is a further object of this invention to provide such a battery tester having minimal thermochromic registration problems during manufacture.

Briefly, these and other objects of the present invention are accomplished by providing a thermochromic apparatus for testing an electrical battery source having a anode terminal and a cathode terminal. The testing apparatus is formed by a dielectric substrate having a single test site thereon. A conductive layer is deposited on the dielectric substrate for conducting a test current from the battery source during testing. The conductive layer has an anode contact for electrical connection to the anode terminal of the battery source, and a cathode contact for electrical connection to the cathode terminal of the battery source. A resistive heater is formed by the conductive layer proximate the single test site for generating heat in response to the test current therethrough. The resistive heat raises the temperature of the single test site from an ambient temperature "Tam" to a higher equilibrium temperature "Teq" determined by the resistive heater and the test status of the battery source. A first thermochromic element is mounted generally on the substrate at the single test site. The first thermochromic element is of a first color which is generally opaque at Tam, and clears at a first temperature T1 which is greater than Tam. A second thermochromic element is also mounted generally on the substrate at the single test site. The second thermochromic element is of a second color which is generally opaque at Tam and T1, and clears at a second temperature T2 which is greater than T1. The first thermochromic element is optically responsive to the heat generated by the test current as Teq approaches T1 for clearing from the opaque to reveal the second color indicating a first test status of the battery source. The second thermochromic element is optically responsive to the heat generated by the test current as Teq approaches T2 for clearing from the opaque to reveal the portion of the substrate underlying the single test site indicating a second test status of the battery source.

BRIEF DESCRIPTION OF THE DRAWING

Further objects and advantages of the present tester and the operation of thermochromic elements will become apparent from the following detailed description and drawing (not drawn to scale) in which.

Figure 1A:
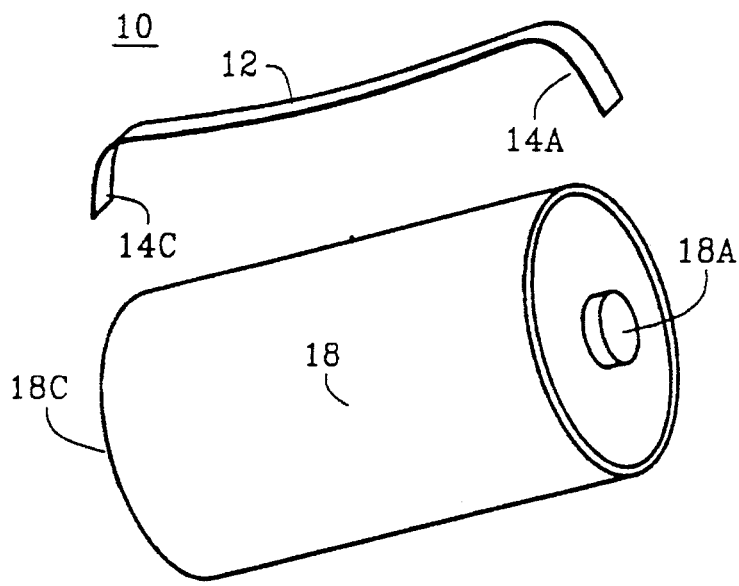
FIG. 1A is a perspective view of a battery tester and a voltage source to be tested.
Figure 1B:
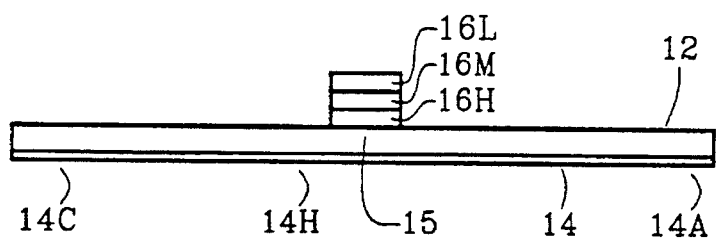
FIG. 1B is a side view of the tester of FIG. 1A.
Figure 1C:
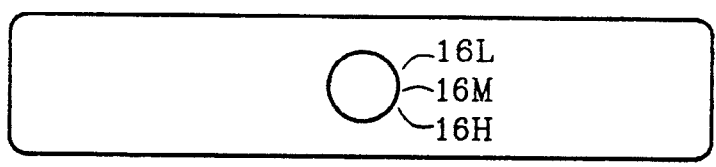
FIG. 1C is a plan view of the oversurface of the tester of FIG. 1A showing the thermochromic elements.

The elements of the invention are designated by two digit reference numerals. The first digit indicates the Figure in which that element is first disclosed or is primarily described. The second digit indicates like features and structures throughout the Figures. Some reference numerals are followed by a letter which indicates a sub-portion or related feature of that element.

GENERAL DESCRIPTION—(FIG. 1 A–D)

Battery tester 10 (FIG. 1A and 1B) is formed by an elongated dielectric substrate member 12, a very thin conductive layer 14 uniformly deposited over the undersurface of the substrate, and a stack of thermochromic elements 16 secured to the oversurface of the substrate at a single test site 15. In the embodiment of FIG. 1, the tester is held against the voltage source to be tested such as dry cell 18. Anode contact 14A at one end of the conductive layer engages anode terminal 18A of the battery; and cathode contact 14C at the other end of the conductive layer engages cathode terminal 18C of the battery.

During testing a small battery current flows through the conductive layer from the anode contact to the cathode contact. A resistive heater 14H is formed proximate the test site by a portion of the conductive layer, for heating the thermochromic elements. The resistive heater establishes a predetermined "test" load on the battery. The test load current "I" and resulting watt density "W" is determined by the voltage relationship:

$$W = V^2/rL^2$$

where

W is the watt density within heater 14H in watts/square cm,

V is the voltage across heater 14H during testing due to the test load current "I", r is the sheet resistivity within heater 14H in ohms/square, and L is the length of the heat generating current path through heater 14H in cm.

Figure 1D:
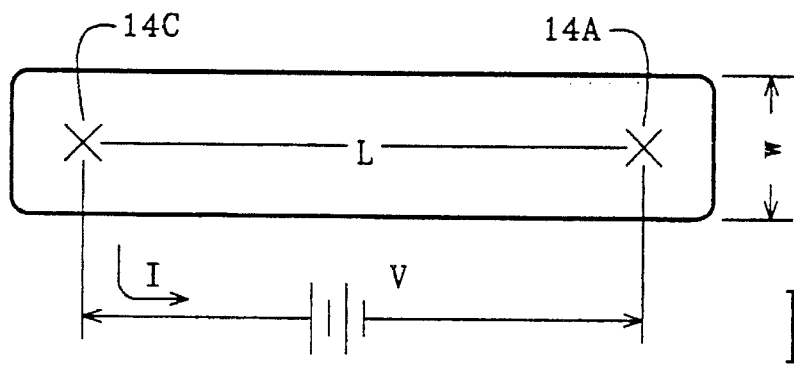
FIG. 1D is a plan view of the undersurface of the tester of FIG. 1A showing the resistive heater path.

In the special case shown in FIG. 1D, the resistive heater is formed by the entire length of the conductive layer, voltage V is the test voltage of the battery, and length L is the distance between anode contact 14A and cathode contact 14C. Because the resistive heater is coextensive with the conductive layer, the test load current "I" uniformly heats the adjacent substrate and the thermochromic elements. The thickness and width of the resistive layer are constant along the length forming part of the "r" term. Typical test voltages for conventional alkaline and carbon batteries may vary from about 0.8 volt to about 1.6 volts. Preferably, the sheet resistivity "r" of the resistive heater is selected from a range of about 0.1 ohms per square to about 1.0 ohms per square.

The thermochromic elements within stack 16 comprise a plurality of two or more suitable thermochromic materials.

Each thermochromic material has a distinct color which clears at progressively higher response temperature. The lowest temperature thermochromic is preferable the darkest in color or shade; and the highest temperature thermochromic is preferable the lightest in color. A medium temperature thermochromic (if any) is preferable a medium color. When battery 18 is at the end of its service life and no longer can supply an adequate voltage under load, the test voltage "V" and the heater current (test load current "I") are low, resulting in a low heating temperature. The lowest temperature thermochromic clears revealing the color of medium temperature thermochromics. When battery 18 is in the middle of its service life, "V" and "I" have a medium value sufficient to cause both the lowest and the medium thermochromics to clear revealing the color of the highest temperature thermochromic. When battery 18 is new, "V" and "I" are high and all of the thermochromic materials clear revealing a thermally passive characteristic of the underlying substrate.

EQUILIBRIUM TEMPERATURE "Teq"

During testing, the test current "I" through the resistive heater causes the test temperature of the tester to increase from an ambient pre-test temperature "Tam" to the equilibrium test temperature "Teq". At "Teq" the heat lost through the oversurface and undersurface of the tester is equal to the heat generated internally by the heater. A weak battery with a low "V" produces a low "I" and a low "Teq" which can not activate the low temperature thermochromic. Heat loss from the vicinity of the thermochromic elements slows the rise of "Teq", causing an increase in the response time of the tester. Further, the absolute rise in test temperature from "Tam" to the maximum "Teq" is limited by the heat loss, and the sequential response temperatures of the indicators must be within this ambient to maximum range.

The two types of heat loss of concern are convective and conductive. Convective loss is heat flow from the oversurface of the tester into the ambient air and is typically small. Air is a good thermal insulator with a low thermal mass which is normally at room ambient temperature. Conductive loss is heat flow from the undersurface of the tester into the battery, and is typically much larger than the convective heat loss. The tester may be mounted on the surface of the battery for testing and subsequent use (see FIGS. 6 and 7). The surface of the battery is generally not as efficient an insulator as air. The adjacent body of the battery has a high thermal mass which may have a temperature lower than the room ambient temperature.

The conductive heat loss into the adjacent mass of the battery may be reduced by insulating the resistive heater from the surface of the battery. The portion of the tester carrying of the indicators may be raised away from the battery by a thermal barrier such as air gap 62G (see FIG. 6). The air gap barrier along the undersurface limits the conductive heat loss causing the test temperature to rise faster to a higher "Teq". An air gap of about 20 mils (or more) provides an adequate temperature change within and a workable response time. Alternatively, the conductive loss may by reduced by providing a suitable thermal insulator under the indicators such as low density foam 72F (see FIG. 7). Preferably insulator barrier 72F is sufficiently compressible to permit insertion of the battery into the service container, and sufficiently resilient to return to the low density state when removed from the container for testing.

SUBSTRATE MEMBER 12 (FIG. 1B)

Substrate member 12 may be is a strong flexible dielectric such as a thin plastic material or closed pore paper for carrying the resistive heater layer. Preferably, the substrate is thin, from about 0.5 mils (0.0128 mm) to about 3.0 mils (0.0768 mm). Thin substrates have less thermal mass and therefore reach equilibrium temperature faster in response to the uniform heater current "I". The shorter response time yields a faster test cycle with minimum power drain from the battery. Further, thin substrates show less bending fatigue. In the battery mounted embodiments of FIGS. 6 and 7, thin substrates add less to the diameter of the battery thereby reducing interference problems with the service container during installation and removal of battery.

RESISTIVE HEATER 14H (FIG. 1B 2A 2B)

Resistive heater 14H (and conductive layer 14) is formed by deposition of a suitable conductive material onto flexible dielectric substrate member 12. Preferably, the resistive heater has a uniform width and a uniform thickness which produces a uniform sheet resistivity and a uniform heat watt density and a uniform equilibrium test temperature Teq within the resistive heater during testing. The conductive material may be evaporated into a chamber and atomically deposited onto the exposed surface of the substrate by a suitable evaporation technique such as vapor deposition or sputter deposition. Preferably the substrate is wide sheet of substrate material supplied from a roll. A blocking aperture defines the deposition area on the sheet, and the speed of the substrate sheet movement passed the aperture precisely controls the deposition thickness of the layer. The thickness and conductance of the layer may be monitored during the deposition process to assure a uniform layer. After applying the thermochromic substance by painting or printing in bands over the substrate sheet; the substrate is sliced down into individual elongated testers having the desired width and length "L".

The atomic nature of the deposition produces a uniform scratch resistant layer intimately associated with the surface of the substrate. The homogeneous structure in the layer provides environmental stability against humidity and temperature.

Stable metals with high electrical conductivity such as Cu, Al, Ag, Au, Ni, or stainless steel are preferred because only a very thin deposition of these metals is sufficient to form the resistive heater. For example, a Cu layer has a sheet resistivity of from about 0.1 to about 1.0 ohms per square when deposited at a thickness of from about 2,000 to about 300 Angstrom units. These extremely thin layers are less subject to bending fatigue caused by compression-tension bending cycles. Further, thin layers require less metal, and can be deposited on the moving substrate at a higher throughput rate. Non-metallic materials such as carbon may also be deposited and used as the resistive heater layer.

Figure 2A:
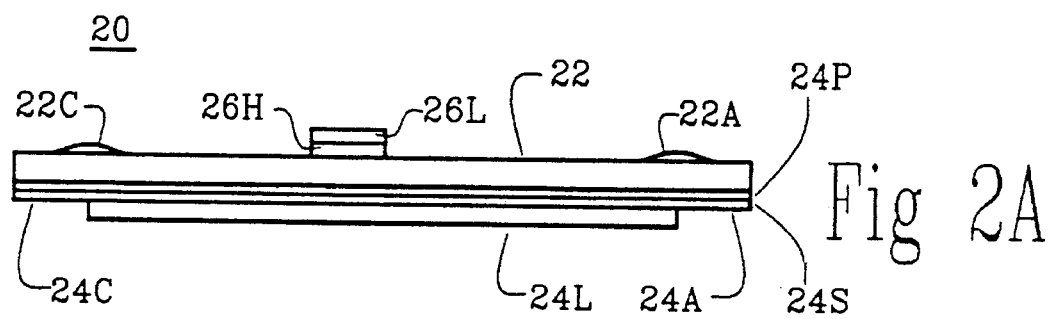
FIG. 2A is a side view of a battery tester with an insulative layer on the undersurface thereof.

Tester 20 has a compound conductive layer (see FIG. 2A) formed by a soft, highly conductive primary layer 24P deposited on substrate 22, covered by a hard secondary layer 24S which is less conductive. For example, 1,000 Angstroms of sputtered Cu may be covered by a vapor deposition of 200 Angstroms of SS (302 stainless steel) without significantly reducing the resistance of the Cu thereunder. The sheet resistivity of Cu is about fifty times the sheet resistivity of SS.

Figure 2B:
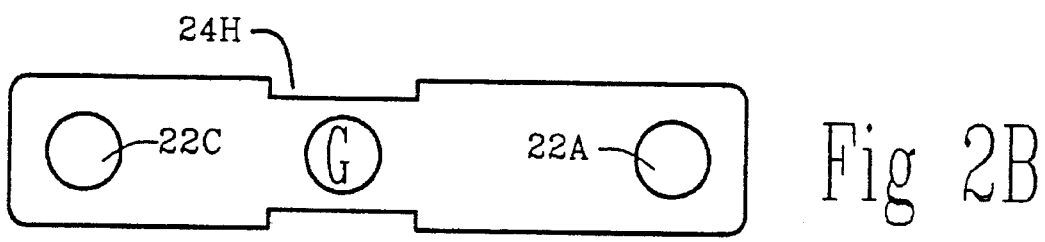
FIG. 2B is a plan view of the oversurface of the tester of FIG. 2A showing the finger pressure points for connecting the tester to a battery.
Figure 2C:
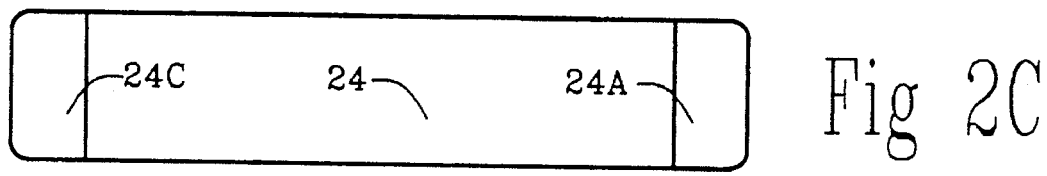
FIG. 2C is a plan view of the undersurface of the tester of FIG. 2A showing the anode and cathode contacts.
Figure 2D:
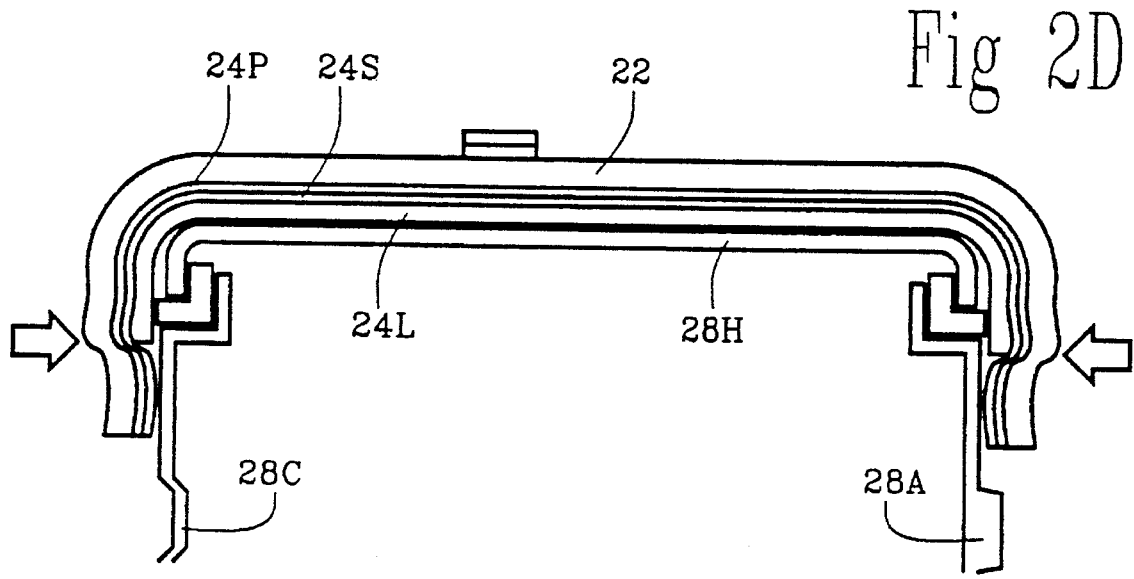
FIG. 2D is a fragmentary view in section of the tester of FIG. 2A showing electrical connection with the battery terminals.

The width of the tester may be varied for increasing or decreasing the resistance of the layer in order to obtain the required test current "I". A very short high resistance path may be employed having a even thinner conductive layer which can be deposited at a faster substrate sheet speed. The resistive heater maybe formed by a segment 24H of conductive layer 24 (see FIG. 2B) having a reduced width or thickness (or both) for producing an enhanced Teq therein which is higher than the Teq within the remainder of the conductive layer.

THERMOCHROMIC MATERIALS

The plurality of stacked thermochromic elements 16 are carried by the substrate proximate the resistive heater, and may be any suitable reversible phase change substances which produce a visible temperature event when the substrate reaches a predetermined equilibrium temperature "Teq" due to the heat generated by the resistive heater. One group of such substances are thermochromic materials.

Another group of suitable phase change substances are mercury salts which change from yellow to orange at 50° C. (silver-mercury salt) and from red to black at 70° C. (copper-mercury salt) in response to increasing temperature. Atomic adjustment of the crystal lattice alters the absorbtion spectrum of the salt.

A further group of suitable phase change substances are liquid crystal materials which change through a sequence of colors (red-green-blue) in response to temperature. The molecular spacing within the crystal shifts causing scattering at progressively shorter wavelengths.

An additional group of suitable phase change substances are refraction scattering materials, which are white due to scattered reflected light when the refraction indexes do not match, and which become clear to reveal an underlying passive feature when the refraction indexes match. For example, three micron wax particles held within a cured silicone binder have mismatched refraction indexes at low temperatures. At higher temperatures, the wax melts forming a liquid with an index which matches the surrounding silicone. The incident light passes through the material and reflects back from the underlying color.

DISCRETE FILM TESTERS (FIG. 1 and 2)

The thermochromic elements forming stack 16 on test site 15 may be a series of vertically stacked discrete films each containing an individual thermochromic dye. Tester embodiment 10 of FIG. 1 shows three films (16L, 16H, and 16H) and tester embodiment 20 of FIG. 2 shows two films (26L and 26H). The first or low temperature thermochromic element 16L (see FIG. 1B) is a discrete film positioned at the top of the stack. The first film is of a first color which is generally opaque at the ambient pre-test temperature Tam of the tester. The first color clears at a first temperature T1 which is greater than Tam. The second or medium temperature thermochromic element 16M is discrete film positioned under the first film in the middle of the stack. The second film is of a second color which is generally opaque at Tam and T1. The second color clears at a second temperature T2 which is greater than T1. The third or high temperature thermochromic element 16H is a discrete film positioned at the bottom of the stack. The third film is of a third color which is generally opaque at Tam and T1 and T2. The third color clears at a third temperature T3 which is greater than T2.

The first thermochromic film at the top of the stack is optically responsive to the heat generated by the test current as the equilibrium test temperature Teq approaches T1 for clearing from the opaque to reveal the color of the second film thereunder indicating a first test status of the battery source. Preferably, the first color is darker than the second color and optically dominates the second color at temperatures less then T1 indicating the pre-test status of the battery source. The second thermochromic film in the middle of the stack is optically responsive to the heat as Teq approaches T2 for clearing to reveal the color of the third film thereunder indicating a second test status of the battery source. Preferably, the second color is darker than the third color and optically dominates the third color at temperatures less then T2. The third thermochromic film at the bottom of the stack is optically responsive as the Teq approaches T3 for clearing to reveal the thermally passive characteristic of the portion of the substrate underlying the test site indicating a third test status of the battery source. Preferably, the third color is darker than the test site and optically dominates the test site at temperatures less then T3.

OPTICAL DOMINATION

The optical domination of each higher temperature underfilm by the adjacent lower temperature overfilm is a function of the color and density of the dye in the overfilm and in the underfilm. An intense dark dye in the overfilm may completely obscure the lighter color of the underfilm. A more moderate overfilm dye may permit some of the underfilm color to show. In order to indicate a test status to the user; the domination of the overfilm need only be sufficient to cause a visually perceptible difference in color as the overfilm clears. The optical dominance of the overfilm and the sequential clearing from the lowest temperature thermochromic to the highest, permits each film to reveal the film thereunder in order from top to bottom as Teq increases. The lowest temperature thermochromic is preferably positioned at the top of the stack which has a slightly lower Teq due to the increased distance from the resistive heater and convective cooling of the surface.

THERMALLY PASSIVE CHARACTERISTIC

The test site is defined by a visual characteristic which is thermally passive; that is, unaffected over the temperature range Tam-T1-T2-T3. The visual characteristic may be an underlying color which is visually distinguishable from the surrounding substrate 12. Alternatively, the test site may not have a special color; but may be just a portion of the substrate. In some embodiments the thermally passive characteristic may include a marking or symbol indicating the highest test status of the battery. Tester embodiment 20 shows the symbol "G" indicating a "good" battery test status (see FIG. 2B).

COMMON FILM TESTER (FIG. 3)

Figure 3:
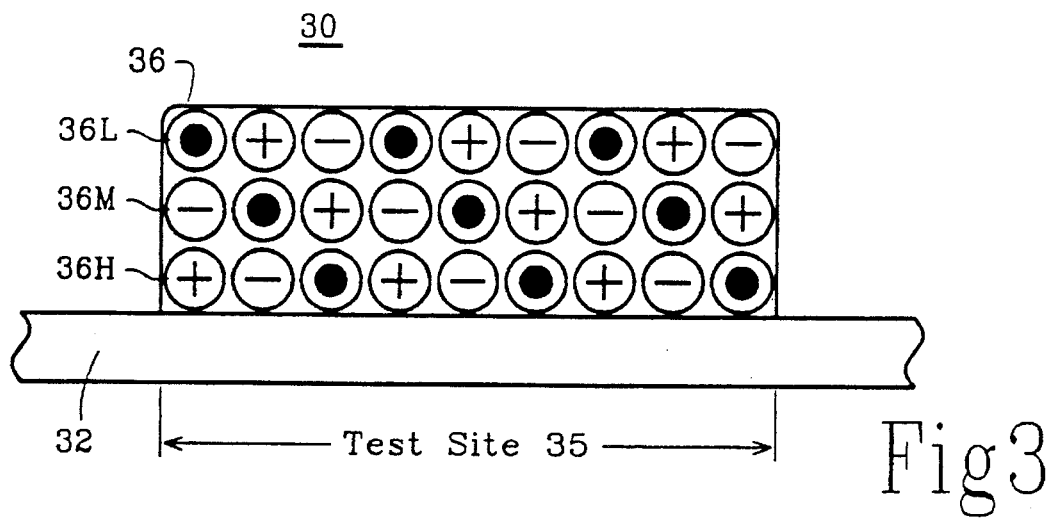
FIG. 3 is a fragmentary sectional view of a substrate with common film thereon containing three thermochromic materials.

The thermochromic elements may be a plurality of dyes mixed together in one common film positioned on the substrate at the test site, in contrast to the single color discrete films of FIGS. 1 and 2. Tester embodiment 30 of FIG. 3 shows a common film 36 with three dyes randomly distributed therein, low temperature dye 36L (shown as a small circle around a dot), medium temperature dye 36M (shown as a small circle around a + sign), and high temperature dye 36H (shown as a small circle around a − sign). The dyes are generally opaque at the ambient pre-test temperature Tam and clear at progressively higher temperatures (T1, T2, T3 etc) to reveal the color of the remaining uncleared dyes for indicating the battery status. The color of the common film may advance through three dominate colors (one for each dye) as Teq increases, finally clearing completely at T3 to reveal substrate 32.

Alternatively, the color of the common film at Tam may be a tri-composite blend, in which each of the three dyes makes a discernable contribution. At T1, dye 36L clears leaving a bi-composite blend of dye 36M and dye 36H, which is visible different from the tri-composite blend. At T2, dye 36M clears leaving only the color of dye 36H, which is visible different from the bi-composite blend and the earlier tri-composite blend. At T3, the remaining dye 36H clears revealing the thermally passive characteristic of the portion of substrate 32 underlying test site 35.

The dyes may chemically separated by a suitable separation structure such as a myriad of tiny microcapsules for chemical isolation. The microcapsules are a few microns in diameter with a very thin wall formed of a polymer. Preferably first thermochromic dye 36L is contained in a first plurality of microcapsules, second thermochromic dye 36M in a second plurality of microcapsules, and third dye 36H in a third plurality of microcapsules. However, chemically compatible dyes may be contained within the same capsules; or not encapsulated at all and instead commingled within the common film.

The three color common film of FIG. 3 may be thicker than any one of the single color discrete films of FIG. 1; but thinner than the total thickness of the three discrete films together. The dyes of both embodiments are stacked in that they extend from the substrate to accommodate the bulk of the three thermochromic dyes.

Figure 4:
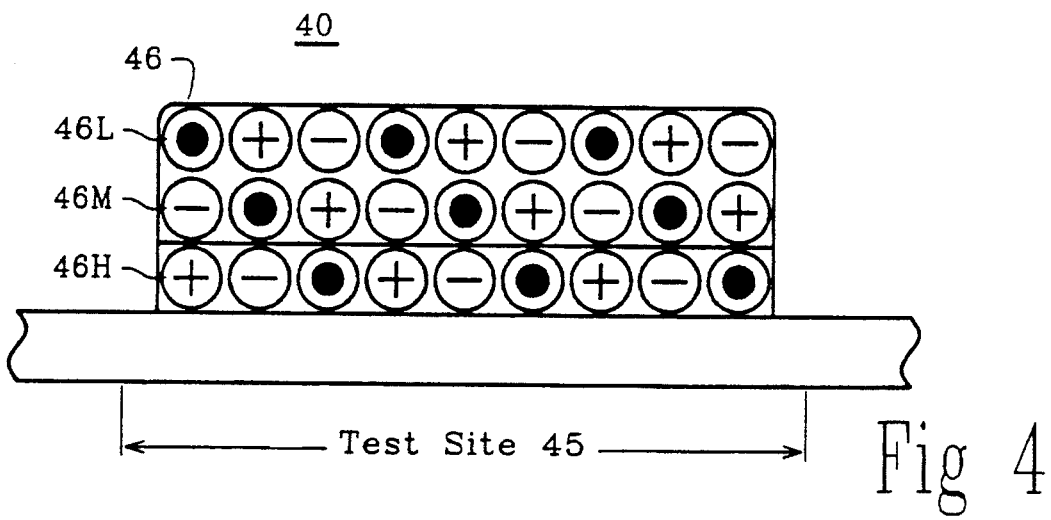
FIG. 4 is a fragmentary sectional view of a substrate with hybrid tester thereon having an upper common film containing two thermochromics and a lower discrete film containing one thermochromic.
Figure 5:
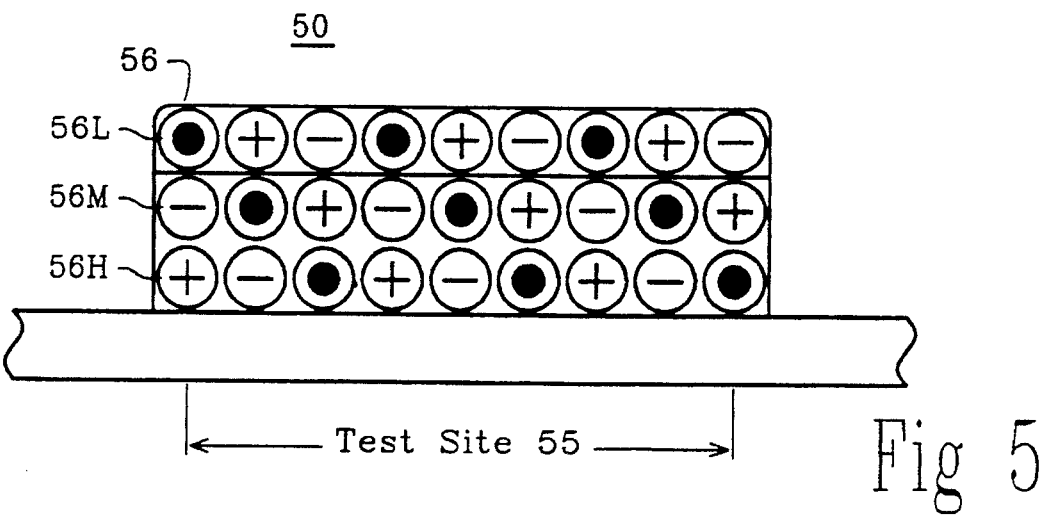
FIG. 5 is a fragmentary sectional view of a substrate with hybrid tester thereon having an upper discrete film containing one thermochromic and a lower common film containing two thermochromics.

HYBRID TESTERS (FIG. 4 and 5)

The thermochromic elements may be a hybrid combination of single dye discrete films and a multi-dye common film with microcapsules. In hybrid tester embodiment 40 of FIG. 4, the first thermochromic element is common film containing a first thermochromic dye 46L (shown as a small circle around a dot) and a second thermochromic dye 46M (shown as a small circle around a + sign) mixed together within the common film. The second thermochromic element is discrete film containing a third thermochromic dye 46H (shown as a small circle around a − sign) and positioned between the common film and the substrate underlying the test site.

In hybrid tester embodiment 50 of FIG. 5, the first thermochromic element is a discrete film containing a first thermochromic dye 56L (shown as a small circle around a dot). The second thermochromic element is common film positioned between the discrete film and the substrate underlying the test site. The common film contains a second thermochromic dye 56M (shown as a small circle around a + sign) and a third thermochromic dye 56H (shown as a small circle around a − sign) mixed together.

REGISTRATION

The area of the discrete thermochromic films may be generally coextensive (in registration) with each other and with the area of the test site, to minimize the substrate area and insulation required by the films. Alternatively, the films may be smaller or larger than each other and the test site in order to minimize the printing tolerance of the films during manufacture. The multi-dye common film is applied to the substrate during a single printing step and therefore has minimal registration considerations. Thermochromic stack 36 of FIG. 3 is shown coextensive with single test site 35. Thermochromic stack 46 of FIG. 4 is shown smaller than single test site 45. Thermochromic stack 56 of FIG. 5 is shown larger than single test site 55.

SHIELD LAYER (FIGS. 2A 2C 2D)

Environmental protection for the resistive heater may be provided by shield layer 24L formed over the conductive layer after deposition onto the substrate. Preferably, the shield is formed of a suitable dielectric material such as polyethylene or UV dielectric ink for electrically insulating the conductive layer from the battery housing 28H (see FIG. 2D). The small exposed layer at each end of conductive layer (see FIG. 2C) is not covered by shield 24L, and defines electrical contacts 24A and 24C of tester 20. Pressure points 22A and 22C on the oversurface of substrate 22 (see FIG. 2A 2B) are located at the preferred spots for application of contact pressure by the user during testing. If desired the pressure points may be identified by a suitable visual device such as colored dots. The center of the pressure points are directly over the end edge of the shield for assuring that area of engagement between tester contacts 24A and 24C and battery terminals 28A and 28C extends to the end edge of the shield (see FIG. 2D). The pressure point engagement limits the effective conductive path between the battery terminals to the layer area covered by the shield. That is, the length of the shield corresponds to the length "L" of the resistive heater in the watt density relationship.

Figure 6:
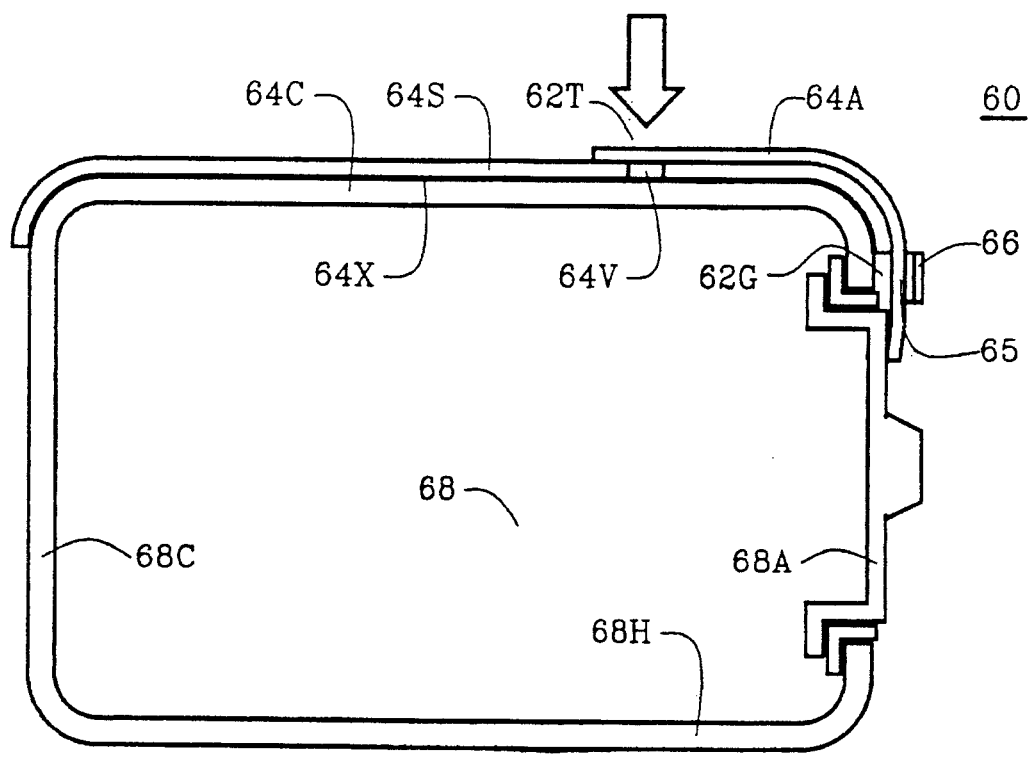
FIG. 6 is a side view in section of a battery unit with a test switch and a thermochromic stack mounted over an air gap.
Figure 7:
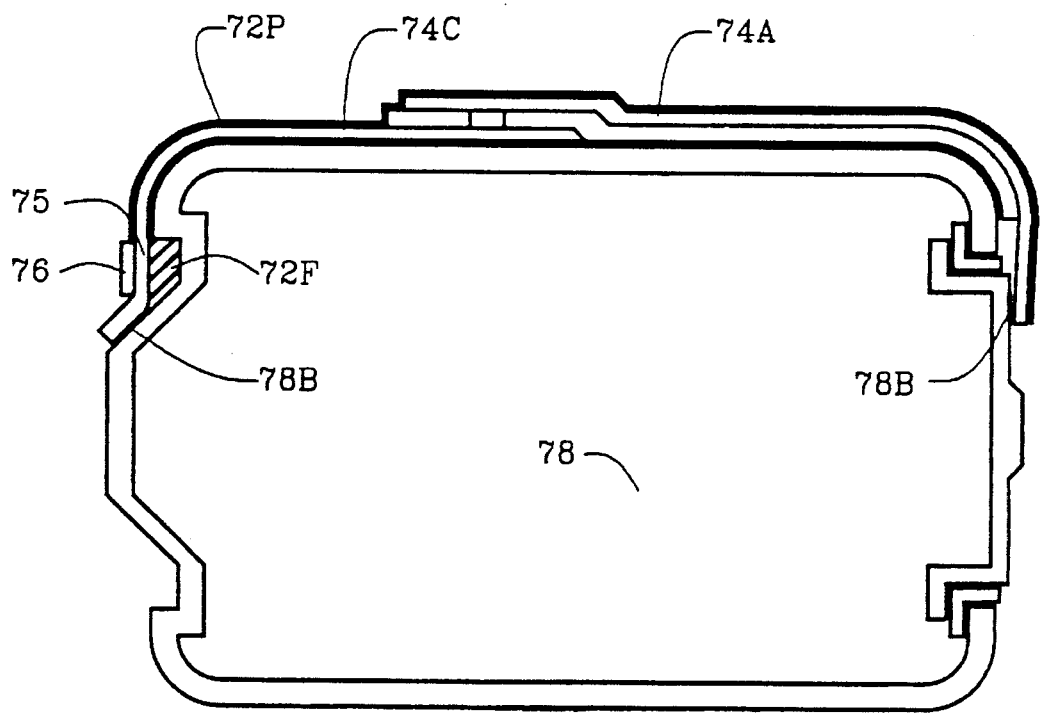
FIG. 7 is a side view in section of a battery unit with a test switch and a thermochromic stack mounted over an thermal insulator.

TEST SWITCH EMBODIMENTS (FIG. 6 and 7)

The battery unit 60 formed by thermochromic tester 66 mounted on battery 68 (see FIG. 6) has a push-to-close test switch 62T in the conductive path between anode terminal 68A at one end of the battery and cathode terminal 68C at the other end. Elongated anode contact 64A extends from the anode terminal and overlaps elongated cathode contact 64C extending from the cathode terminal. Spacer 64S formed of a suitable resilient dielectric material is positioned between the overlapping upper contact 64A and lower contact 64C for preventing electrical contact therebetween. The spacer has void 64V therein where the overlapping contact areas are mutually exposed but spaced apart due to the resilience of the dielectric spacer material adjacent to the void.

The spacer defines a normally open, non-test position in which the overlapping contact areas are not in electrical contact. The user pushes the overlying anode contact area into electrical engagement with the underlying cathode contact area by pressing the switch proximate the void (see FIG. 6, arrow E). The overlapping contact areas remain in this closed test position for as long as the user maintains pressure on the switch.

The overlying contact may be anode contact 64A and the underlying contact may be cathode contact 64C, as shown in FIG. 6. Alternatively, the overlying contact may be cathode contact 74C and the underlying contact may be anode contact 74A as shown in the battery unit of FIG. 7.

The cathode contact may be an integral part of the metal battery housing 68H as shown in FIG. 6, or the cathode contact may be additional conductive material connected to the housing as shown in FIG. 7. Permanent electrical contact may be established between the tester contacts and the battery terminals by a suitable conductive connector technique such as heat bonding. A printable, conductive, hot melt material 78B is applied to the tester contacts (or to the bonding area on the battery terminals) and for heat bonding the contact to the terminal.

The thermochromic tester stack may be mounted at the single test site at either end of the electrical battery. In FIG. 6, thermochromic stack 66 and single test site 65 are shown at the anode end of electrical battery 68. In FIG. 7, thermochromic stack 76 and single test site 75 are shown at the cathode end of electrical battery 78. A thermal barrier may be provided between the electrical battery and the dielectric substrate means directly under the single test site for minimizing heat flow from the thermochromic stack into the electrical battery during testing. In FIG. 6, the thermal barrier is air gap 62G in the space under single test site 65. Anode battery terminal 68A extends slightly away from the end of battery 68 establishing a slight air space under the single test site which forms the thermal barrier. In FIG. 7, the thermal barrier is thermal insulator 72F under single test site 75. A environmental protection may be provided over the upper contact by a protective cover 72P formed of a suitable material such as 0.2 mil UV epoxy coating.

If desired, a suitable adhesive material 64X for securing the tester to the housing of the battery (see FIG. 7). The adhesive may be permanent for holding the tester to the housing for the life of the battery forming a unit. Alternatively, the adhesive may be reusable, permitting the user to remove the tester from the battery after the test. The tester may be shipped separate from the battery to be tested, and then permanently mounted on the battery or temporarily held against the battery during testing.

The tester may be mounted on the battery with either contact engaging the battery cathode terminal, and the remaining contact engaging the battery anode terminal. The tester is without polarity, and is completely reversible. The tester may have short contacts extending only part way over the battery terminals, so as not to interfere with electrical connection to the adjacent battery.

SPECIFIC EMBODIMENT

The following particulars of the battery tester are given as an illustrative example of resistive heater and response temperatures of the indicators. In this example:

The battery source is a 1.5 volt "C" cell.

Resistive Heater 14 is copper layer having a sheet resistivity "r" of about 0.22 ohms/square, and a length of 2¼ inches (5.8 cm).

Substrate 12 is 2 mil polyester.

The low temperature thermochromic material has a response temperature of about 37° C. for test voltages of from about 0.9 to about 1.1 volts.

The middle temperature thermochromic material has a response temperature of about 45° C. for test voltages of from about 1.1 to about 1.3 volts.

The high temperature thermochromic material has a response temperature of about 53° C. for test voltages greater then about 1.3 volts.

The air gap between the tester and the battery surface is about 50 mils.

The values, dimensions, material and temperatures given above are not intended as defining the limitations of the invention. Numerous other applications and configurations are possible.

INDUSTRIAL APPLICABILITY

It will be apparent to those skilled in the art that the objects of this invention have been achieved as described hereinbefore by providing an environmentally stable resistive heater formed by a metal conductive layer which is less effected by ambient temperature and humidity. The accuracy of the present tester is not dependent on the length of the resistive heater because the temperature is uniform along the heater. The uniform equilibrium temperature increase the dynamic range of the present tester because by eliminating the "hot spot" found in earlier tapered testers. The uniform equilibrium temperature also permits the thermochromic device to be positioned anywhere along the heater. Thermal registration is not required. The thinness of the conductive layer supports sharp bends and creasing without undue fatigue or alteration of the uniform sheet resistivity.

CONCLUSION

Clearly various changes may be made in the structure and embodiments shown herein without departing from the concept of the invention. For example the thermochromic indicator may be placed directly over the conductive layer or on the opposite side of the substrate. Further, features of the embodiments shown in the various Figures may be employed with the embodiments of the other Figures.

Therefore, the scope of the invention is to be determined by the terminology of the following claims and the legal equivalents thereof.

I claim as my invention:

1. A battery unit which may be tested by a user to determine the test status thereof, comprising:

an electrical battery for supplying a test current during the testing, having an anode end with an anode terminal means and cathode end with a cathode terminal means;

a dielectric substrate with a single test site thereon, mounted on the electrical battery;

conductive means on the dielectric substrate and having an anode end for electrically engaging the anode terminal means of the electrical battery, and having a cathode end for electrically engaging the cathode terminal means of the electrical battery;

a resistive heater means formed by a segment of the conductive means proximate the single test site for generating heat in response to the test current flowing therethrough, which raises the temperature of the single test site from an initial temperature to a higher temperature determined by the test status of the battery and the resistive heater means, wherein the segment of the conductive means forming the resistive heater means has a constant width for producing a substantially constant temperature (the test temperature) throughout the entire test site;

at least two thermochromic layers stacked on said substrate at said test site, a first thermochormic layer over a second thermochromic layer, said thermochromic layers being stacked at the test site so that the second thermochromic layer is closer to the test site on the substrate than is the first thermochromic layer, whereby during battery testing the first thermochromic layer is closer to the viewer than the second thermochromic layer, said first thermochromic layer being of a first color which is generally opaque at said initial temperature, and clear at a test temperature (T1) which is greater than the initial temperature thereby revealing the color of the second thermochromic layer to indicate that the battery is at least partially operable;

said second thermochromic layer being of a second color which is generally opaque at said initial temperature and T1, and clear at a test temperature (T2) which is greater than T1 thereby revealing the color of a layer of material therebelow to indicate that the battery is stronger than if only the first thermochromic layer has cleared; and thermal barrier means between the electrical battery and the dielectric substrate directly under the single test site for minimizing heat flow from the first and second thermochromic layers into the electrical battery during testing.

2. The unit of claim 1, wherein the first and second thermochromic layers are mounted at the single test site at one end of the electrical battery.

3. The unit of claim 2, wherein the single test site is at the anode end of the electrical battery.

4. The unit of claim 2, wherein the single test site is at the cathode end of the electrical battery.

5. The unit of claim 2, wherein the battery terminal means at the one end of the electrical battery extends slightly away from the one end establishing a slight space under the single test site which forms the thermal barrier means between the electrical battery and the conductive means under the single test site.

6. The unit of claim 5, wherein the thermal barrier means is an air gap in the space under the single test site.

7. The unit of claim 5, wherein the thermal barrier means is a thermal insulator in the space under the single test site.

8. the unit of claim 1, further comprising an adhesive material between the electrical battery and the dielectric substrate for securing the dielectric substrate to the electrical battery.

9. The unit of claim 1, wherein the anode end and cathode end of the conductive means is heat bonded to the anode terminal and cathode terminal of the electrical battery.

10. The unit of claim 1 further comprising an electrical test switch means in the conductive means between the anode and cathode ends of said conductive means, having a normally open non-test position and a closed test position during testing to permit the flow of test current during testing, wherein the anode end of said conductive means electrically engages the anode terminal of the electrical battery and the cathode end of said conductive means electrically engages the cathode terminal of the electrical battery.

11. The unit of claim 10, wherein the test switch means comprises:

an overlying portion of the conductive means extending from one end thereof forming an upper contact means, and an underlying portion extending from the other end thereof forming a lower contact means;

a dielectric spacer means positioned between the overlying portion and underlying portion of the conductive means, the dielectric spacer means having a void therein where the upper contact means and the lower contact means are mutually exposed but spaced apart due to the dielectric spacer means adjacent to the void for preventing electrical contact therebetween to maintain the test switch means in the normally open non-test position.

12. The unit of claim 11, wherein the closed test position is established by pushing the dielectric spacer means proximate the void therein causing the upper contact means to engage the lower contact means.

13. The unit of claim 12, wherein the dielectric spacer means is formed of a resilient material.

14. The unit of claim 11, further comprising a protective cover means over the overlying portion of the conductive means.

* * * * *